United States Patent
Schwarz et al.

(10) Patent No.: US 9,285,432 B2
(45) Date of Patent: Mar. 15, 2016

(54) METHOD AND SYSTEM FOR CONTROLLING A VEHICLE BATTERY

(75) Inventors: Jonathan R. Schwarz, Clawson, MI (US); Gregory E. Smith, Toledo, OH (US); Damon R. Frisch, Troy, MI (US); Brian J. Koch, Berkley, MI (US); James C. Gibbs, Brighton, MI (US); Brandon R. Jones, White Lake, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 208 days.

(21) Appl. No.: 13/190,933

(22) Filed: Jul. 26, 2011

(65) Prior Publication Data

US 2013/0027048 A1     Jan. 31, 2013

(51) Int. Cl.
*G01N 27/416* (2006.01)
*G01R 31/36* (2006.01)
*B60L 3/12* (2006.01)
(Continued)

(52) U.S. Cl.
CPC ............ *G01R 31/3648* (2013.01); *B60L 3/12* (2013.01); *B60L 7/14* (2013.01); *B60L 11/005* (2013.01); *B60L 11/126* (2013.01); *B60L 11/14* (2013.01); *B60L 11/1857* (2013.01); *B60L 11/1862* (2013.01); *B60L 11/1877* (2013.01); *B60L 11/1879* (2013.01); *H01M 10/44* (2013.01); *H01M 10/48* (2013.01); *B60L 2210/30* (2013.01); *B60L 2210/40* (2013.01); *B60L 2240/545* (2013.01); *B60L 2240/547* (2013.01); *B60L 2240/549* (2013.01); *B60L 2260/42* (2013.01);

(Continued)

(58) Field of Classification Search
USPC .................................... 324/432, 427
See application file for complete search history.

(56) References Cited

U.S. PATENT DOCUMENTS

| 6,580,977 | B2* | 6/2003 | Ding et al. ................ 701/22 |
| 7,193,391 | B2* | 3/2007 | Moore ...................... 320/116 |
| 7,710,073 | B2* | 5/2010 | Yamauchi et al. ........ 320/128 |
| 7,830,126 | B2* | 11/2010 | Kawahara et al. ....... 320/160 |
| 8,299,757 | B2* | 10/2012 | Yamauchi et al. ....... 320/132 |
| 2006/0033475 | A1 | 2/2006 | Moore |

(Continued)

FOREIGN PATENT DOCUMENTS

| EP | 1480051 A2 * | 11/2004 |
| JP | 2007323999 A | 12/2007 |
| WO | WO 2010112997 A1 * | 10/2010 |

OTHER PUBLICATIONS

Blanke et al. "Impedance measurements on lead-acid batteries for state-of-charge, state-of-health and cranking capability prognosis in electric and hybrid electric vehicles", Journal of Power Sources, 144(2), pp. 418-425, Dec. 2004.*

(Continued)

*Primary Examiner* — Richard Isla Rodas
*Assistant Examiner* — David V Henze-Gongola
(74) *Attorney, Agent, or Firm* — Reising Ethington, P.C.; Lionel D. Anderson (57) ABSTRACT

A method and system for manipulating, adjusting or otherwise controlling a state-of-charge (SOC) operating range for a high voltage vehicle battery, such as the type used for hybrid or electric vehicle propulsion. By providing a dynamic SOC operating range that changes in response to changing battery conditions, the battery performance may be improved so that the battery life is extended. Depending on the particular embodiment, the dynamic SOC operating range may have different combinations of hard and/or soft boundaries or limits.

13 Claims, 3 Drawing Sheets

(51) Int. Cl.
  *B60L 7/14* (2006.01)
  *B60L 11/00* (2006.01)
  *B60L 11/12* (2006.01)
  *B60L 11/14* (2006.01)
  *B60L 11/18* (2006.01)
  *H01M 10/44* (2006.01)
  *H01M 10/48* (2006.01)
  *H01M 10/42* (2006.01)

(52) U.S. Cl.
  CPC .... *H01M 2010/4271* (2013.01); *Y02T 10/6217* (2013.01); *Y02T 10/7005* (2013.01); *Y02T 10/705* (2013.01); *Y02T 10/7022* (2013.01); *Y02T 10/7044* (2013.01); *Y02T 10/7077* (2013.01); *Y02T 10/7241* (2013.01)

(56) References Cited

U.S. PATENT DOCUMENTS

| | | | |
|---|---|---|---|
| 2006/0068272 A1* | 3/2006 | Takami et al. | 429/62 |
| 2008/0084186 A1 | 4/2008 | Elder et al. | |
| 2011/0156641 A1* | 6/2011 | Kishiyama et al. | 320/109 |
| 2011/0156657 A1* | 6/2011 | Anderson | 320/134 |
| 2011/0156687 A1 | 6/2011 | Gardner | |
| 2011/0239445 A1* | 10/2011 | Ibi et al. | 29/623.1 |
| 2011/0309791 A1* | 12/2011 | Mitake et al. | 320/108 |
| 2012/0032647 A1* | 2/2012 | Watanabe et al. | 320/136 |
| 2013/0015860 A1* | 1/2013 | Crombez | 324/433 |

OTHER PUBLICATIONS

Chinese Office action dated Jun. 4, 2014, 6 pages.
Chinese Office Action for Application No. 201210261196.0, dated Feb. 3, 2015, 6 pages.

* cited by examiner

METHOD AND SYSTEM FOR CONTROLLING A VEHICLE BATTERY

TECHNICAL FIELD

The present invention generally relates to vehicle batteries and, more particularly, to methods and systems for controlling vehicle batteries that may be used for vehicle propulsion.

BACKGROUND

Vehicles that use high voltage batteries for vehicle propulsion (e.g., battery electric vehicles (BEVs), hybrid electric vehicles (HEVs), plug-in hybrid electric vehicles (PHEVs), extended range electric vehicles (EREVs), etc.) typically try to maintain the battery within a certain state-of-charge (SOC) operating range. The SOC operating range may be influenced by different factors or considerations, including desired battery performance, battery life, and fuel economy. Those skilled in the art will appreciate that there may be some tradeoffs in terms of how these considerations impact the desired SOC operating range, as improvements to one factor can negatively affect another.

Furthermore, battery conditions for a high voltage vehicle battery can change over time due to factors like battery age, battery temperature, battery charging and discharging history, etc. Controlling or manipulating an SOC operating range in a way that takes various considerations and/or tradeoffs into account can therefore be quite challenging, particularly when the battery conditions are changing over time.

SUMMARY

According to one embodiment, there is provided a method for controlling a vehicle battery. The method may comprise the steps of: (a) determining a present state of the vehicle battery, wherein the vehicle battery is at least partially used for vehicle propulsion; (b) evaluating the present state of the vehicle battery to determine if the vehicle battery has experienced a reduction in battery performance; and (c) if the vehicle battery has experienced a reduction in battery performance, then adjusting a state-of-charge (SOC) operating range so that the battery performance is improved.

DRAWINGS

Preferred exemplary embodiments will hereinafter be described in conjunction with the appended drawings, wherein like designations denote like elements, and wherein.

DESCRIPTION

The method and system described herein may be used to manipulate, adjust or otherwise control a state-of-charge (SOC) operating range for a high voltage vehicle battery, such as the type used for hybrid or electric vehicle propulsion. By providing a dynamic SOC operating range that changes in response to changing battery conditions, the battery performance may be improved so that the battery life is extended.

To illustrate this point, consider an alternative situation where a vehicle battery uses a static state-of-charge (SOC) operating range over its entire operational life, even though the battery performance slowly degrades over the same period. There comes a point when the battery performance falls below some minimal threshold of acceptability, at which time the vehicle battery would typically need to be replaced. Instead of simply replacing the vehicle battery, the present method and system are able to make adjustments to the SOC operating range that improve battery performance to a level that is once again acceptable. This, in turn, may extend the battery life as the vehicle battery would no longer need to be replaced at that moment. Even if the adjustments to the SOC operating range result in an accelerated degradation in terms of battery life—there is oftentimes a tradeoff between battery performance and battery life—the adjustments may still be desirable if they postpone replacement of the vehicle battery.

Figure 1:
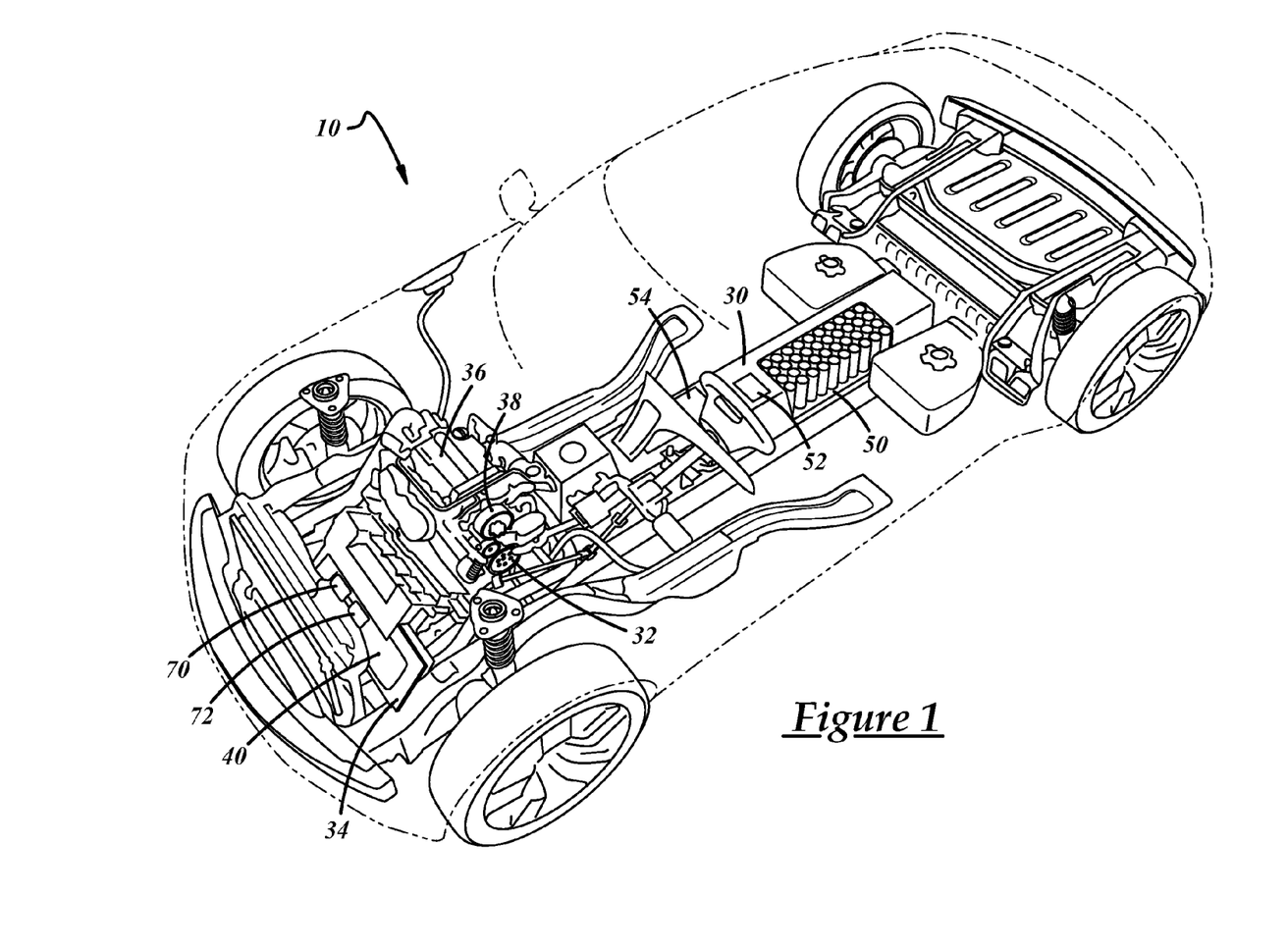
FIG. 1 is a perspective view depicting portions of an exemplary vehicle.

With reference to FIG. 1, there are shown portions of an exemplary vehicle 10 may use the method and system described below. It should be appreciated that FIG. 1 is only a schematic representation of certain portions of a vehicle and that the method and system described herein could be used with any number of different vehicles and are not limited to the exemplary one shown here. For example, the present method and system may be used with a hybrid electric vehicle (HEV), a plug-in hybrid electric vehicle (PHEV), an extended-range electric vehicle (EREV), a battery electric vehicle (BEV), or any other vehicle that at least partially uses a vehicle battery for vehicle propulsion. According to one example, vehicle 10 is an extended range electric vehicle (EREV) and generally includes a vehicle battery 30, an electric motor 32, an inverter/converter 34, an engine 36, a generator 38, and a control module 40. Because many of the components of vehicle 10 are generally known in the art and because the present method may be used with many different vehicle types, a brief explanation is provided here in lieu of a detailed recitation of their individual structure and functionality.

Vehicle battery 30 may store electrical energy that is at least partially used for vehicle propulsion, as well as to meet the other electrical needs of the vehicle. According to an exemplary embodiment, battery 30 includes a high-voltage battery pack 50 (e.g., 40V-600V), a battery sensor unit 52, and a battery control unit 54. Battery pack 50 may include a number of individual battery cells and may utilize any suitable battery chemistry, including those that are based on the following technologies: lithium ion, nickel metal hydride (NiMH), nickel cadmium (NiCd), sodium nickel chloride (NaNiCl), or some other battery technology. Battery 30 should be designed to withstand repeated charge and discharge cycles and may be used in conjunction with other energy storage devices, such as capacitors, super capacitors, inductors, etc. Those skilled in the art will appreciate that the vehicle battery may be provided according to any number of different embodiments, may be connected in any number of different configurations, and may include any number of different sub-components, like sensors, control units and/or any other suitable components known in the art.

Battery sensor unit 52 may include any variety of different sensing components or elements, and may monitor a variety of battery conditions such as battery voltage, current, state of charge (SOC), state of health (SOH), temperature, etc. In some cases, it may even be possible for battery sensor unit 52 to directly measure battery capacity and/or battery resistance. Sensor unit 52 may include sensors that are integrated within vehicle battery 30 (e.g., an intelligent or smart battery), are externally located outside of the battery, or are provided according to some other known arrangement. Battery sensor unit 52 may monitor, sense or otherwise determine battery conditions on a cell-by-cell basis, as an average of a collection or block of cells or region of the battery pack, as an average of the entire battery pack, or according to some other method known in the art. Output from battery sensor unit 50 may be provided to battery control unit 54, control module 40, or some other appropriate device.

Battery Control unit 54 may include any variety of electronic processing devices, memory devices, input/output (I/O) devices, and other known components, and may perform various control and/or communication related functions. For example, battery control unit 54 could receive sensor signals from battery sensor unit 52, package the sensor signals into an appropriate sensor message, and send the sensor message to control module 40 over a suitable connection, such as a CAN bus, a system management bus (SMBus), a proprietary communication link, or any other communication means known to those skilled in the art. It is possible for battery control unit 54 to gather battery sensor readings and store them in local memory so that a comprehensive sensor message can be provided to control module 40 at a later time, or the sensor readings can be forwarded to module 40 or some other destination as soon as they arrive at control unit 54, to cite a few possibilities. In another capacity, battery control unit 54 can store pertinent battery characteristics and background information pertaining to the battery's cell chemistry, cell capacity, upper and lower battery voltage limits, battery current limits, battery temperature limits, temperature profiles, battery impedance, number or history of charge/discharge events, etc.

Electric motor 32 may use electrical energy stored in vehicle battery 30 to drive one or more vehicle wheels, which in turn propels the vehicle. While FIG. 1 schematically depicts electric motor 32 as a single discrete device, the electric motor may be combined with a generator (a so-called "mogen") or it may include multiple electric motors (e.g., separate motors for the front and rear wheels, separate motors for each wheel, separate motors for different functions, etc.), to cite a few possibilities. Vehicle 10 is not limited to any one particular type of electric motor, as many different motor types, sizes, technologies, etc. may be used. In one example, electric motor 32 includes an AC motor (e.g., a three-phase AC induction motor, a multi-phase AC induction motor, etc.), as well as a generator that can be used during regenerative braking. Electric motor 32 may be provided according to any number of different embodiments (e.g., AC or DC motors, brushed or brushless motors, permanent magnet motors, etc.), it may be connected in any number of different configurations, and it may include any number of different components, like cooling features, sensors, control units and/or any other suitable components known in the art.

Inverter/converter 34 may act as an intermediary between vehicle battery 30 and electric motor 32, as these two devices are often times designed to function according to different operational parameters. For example, during vehicle propulsion inverter/converter 34 may step-up the voltage from battery 30 and convert the current from DC to AC in order to drive electric motor 32, while during regenerative braking the inverter/converter may step-down the voltage generated by a braking event and convert the current from AC to DC so that it can be properly stored by the battery. In a sense, inverter/converter 34 manages how these different operational parameters (i.e., AC versus DC, various voltage levels, etc.) work together. Inverter/converter 34 may include an inverter for DC to AC conversion, a rectifier for AC to DC conversion, a step-up converter or transformer for increasing the voltage, a step-down converter or transformer for decreasing the voltage, other suitable energy management components, or some combination thereof. In the exemplary embodiment shown, inverter and converter units are integrated into a single bi-directional device; however, other embodiments are certainly possible. It should be realized that inverter/converter 34 may be provided according to any number of different embodiments (e.g., with separate inverter and converter units, bi-directional or uni-directional, etc.), may be connected in any number of different configurations, and may include any number of different components, like cooling systems, sensors, control units and/or any other suitable components known in the art.

Engine 36 may drive generator 38 using conventional internal combustion techniques, and may include any suitable type of engine known in the art. Some examples of suitable engines include gasoline, diesel, ethanol, flex-fuel, naturally aspirated, turbo-charged, super-charged, rotary, Otto-cycle, Atkins-cycle and Miller-cycle engines, as well as any other suitable engine type known in the art. According to the specific embodiment shown here, engine 36 is a small fuel-efficient engine (e.g., a small displacement, turbo-charged four-cylinder engine) that uses its mechanical output to turn generator 38. Skilled artisans will appreciate that engine 36 may be provided according to any number of different embodiments, may be connected in any number of different configurations (e.g., engine 36 could be part of a parallel hybrid system where the engine is also mechanically coupled to the vehicle wheels instead of exclusively being used to generate electricity), and may include any number of different components, like sensors, control units and/or any other suitable components known in the art.

Generator 38 is mechanically coupled to engine 36 so that the mechanical output of the engine causes the generator to create electrical energy that may be provided to vehicle battery 30, electric motor 32, or both. It is worth noting that generator 38 may be provided according to any number of different embodiments (e.g., the generator of motor 32 and generator 38 may be combined into a single unit), may be connected in any number of different configurations, and may include any number of different components, like sensors, control units and/or any other suitable components known in the art. Generator 38 is not limited to any specific generator type or embodiment.

Control module 40 may be used to control, govern or otherwise manage certain operations or functions of vehicle 10 and, according to one exemplary embodiment, includes a processing device 70 and a memory device 72. Processing device 70 may include any type of suitable electronic processor (e.g., a microprocessor, a microcontroller, an application specific integrated circuit (ASIC), etc.) that executes instructions for software, firmware, programs, algorithms, scripts, etc. This processor is not limited to any one type of component or device. Memory device 72 may include any type of suitable electronic memory means and may store a variety of data and information. This includes, for example: sensed vehicle conditions; look-up tables and other data structures; software, firmware, programs, algorithms, scripts, and other electronic instructions; component characteristics and background information, etc. The present method—as well as any other electronic instructions and/or information needed for such tasks—may also be stored or otherwise maintained in memory device 72. Control module 40 may be electronically connected to other vehicle devices and modules via I/O devices and suitable connections, like a communications bus, so that they can interact as required. These are, of course, only some of the possible arrangements, functions and capabilities of control module 40, as others are certainly possible. Depending on the particular embodiment, control module 40 may be a stand-alone electronic module (e.g., a vehicle integration control module (VICM), a traction power inverter module (TPIM), a battery power inverter module (BPIM), etc.), it may be incorporated or included within another electronic module in the vehicle (e.g., a power train control module, an engine control module, a hybrid control module, etc.), or it may be part of a larger network or system (e.g., a battery management system (BMS), a vehicle energy management system, etc.), to name a few possibilities.

Again, the preceding description of exemplary vehicle 10 and the drawing in FIG. 1 are only intended to illustrate one potential vehicle arrangement and to do so in a general way. Any number of other vehicle arrangements and architectures, including those that differ significantly from the one shown in FIG. 1, may be used instead.

Figure 2:
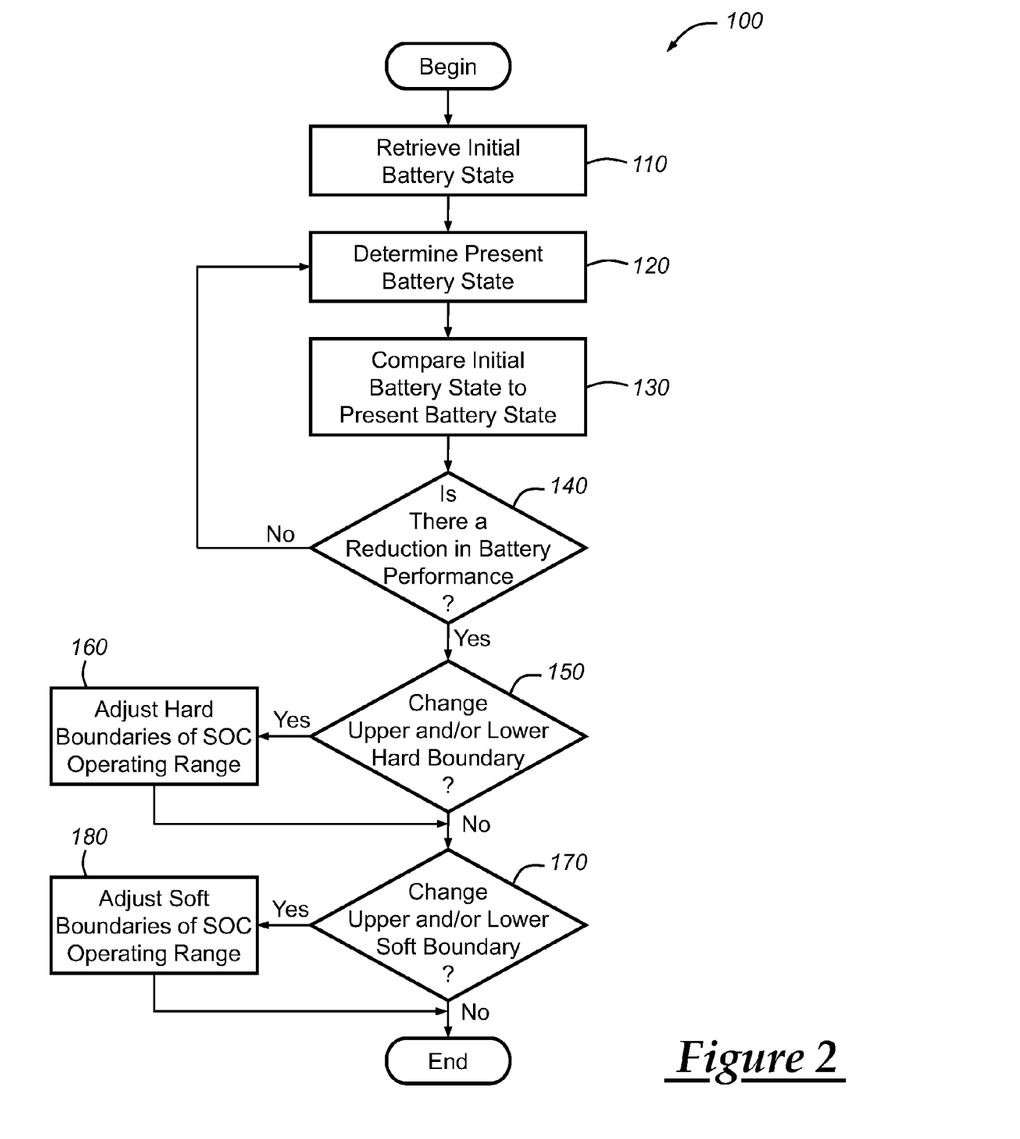
FIG. 2 is a flowchart illustrating steps of an exemplary method that may be used with a vehicle, such as the vehicle shown in FIG. 1.

Turning now to FIG. 2, there is shown an exemplary method 100 for controlling a state-of-charge (SOC) operating range for a high-voltage vehicle battery, like vehicle battery 30, so that battery performance and battery life may be improved. Step 110 is an optional step where the method retrieves a value or parameter known as an initial battery state. The "initial battery state," as used herein, broadly refers to any battery characteristic, parameter, condition and/or other value that describes the state or status of the battery at some previous time (e.g., when the battery was new). For example, the initial battery state may refer to the battery capacity or battery resistance when the battery was first manufactured. This can provide the method with a reference point when subsequently evaluating a present state of the battery. According to one example, step 110 retrieves an initial battery state value from an electronic memory device, such as those found in battery control unit 54, control module 40 or elsewhere. The initial battery state may be expressed in terms of battery capacity, battery resistance, state-of-health (SOH), state-of-charge (SOC), some other battery condition, or a combination thereof. The initial battery state may be used in subsequent evaluations or comparisons, as will be explained. Other techniques for determining an initial battery state are surely possible, as any suitable method may be used.

Step 120 determines a present battery state for the vehicle battery. The "present battery state," as used here, is much like the initial battery state, but instead pertains to a condition, status, and/or state of the vehicle battery at the present time. The present battery state may be directly measured via sensors or it may be indirectly calculated or deduced through other battery conditions or readings. For example, it is possible for sensors 52 to directly measure the battery capacity and/or resistance, or for the sensors to measure battery voltage, current, temperature, etc. and then indirectly deduce battery capacity and/or resistance from these readings. Amp hour throughput is another parameter that may be used by step 120 to ascertain the present battery state. In a general sense, battery capacity relates to the battery's energy or ability to store energy, while battery resistance pertains to the battery's power or ability to deliver power. The components used to determine the initial and/or present battery state may be located within vehicle battery 30 or they may be external to the battery. It should be appreciated that step 120 is not limited to any particular technique or method, and that any suitable means for determining the present battery state may be used.

Next, step 130 evaluates the present battery state in order to determine if the vehicle battery has experienced a reduction in battery performance. This may be performed in any number of different ways. For instance, control unit 54 may compare the initial battery state (e.g., a battery capacity or battery resistance value retrieved from memory) to the present battery state to determine if there has been a degradation or reduction in the performance of battery 30. In another embodiment, control unit 54 compares the present battery state to a battery threshold that is stored in memory, as opposed to an initial battery state value, in order to determine if and how much battery degradation has taken place. To illustrate this embodiment, consider the example where step 130 compares the present battery state in the form of a measured or calculated battery resistance with a battery resistance threshold stored in memory. This comparison may indicate how much, if at all, the battery has degraded through an increase in the internal resistance of the battery. If the present battery resistance is greater than the threshold, this could indicate a situation where the battery may not produce enough power to meet all of the vehicle's electrical needs; accordingly, some changes to the SOC operating range may be needed. In another example, step 130 could compare the present battery capacity to some capacity threshold; if the present capacity is less than the threshold, the vehicle battery may not be able to sufficiently receive and store energy. Other methods and techniques for evaluating or comparing the vehicle battery may also be used, as the ones described here are merely examples.

If there has been no reduction in battery performance or if the reduction is minimal, then step 140 may determine that adjusting a state-of-charge (SOC) operating range is not warranted and may send control of the method back to step 120 for further monitoring. This could be the case if the vehicle battery presently exhibits similar battery capacity and/or resistance values as it did when it was new, for example. If, on the other hand, a significant reduction in battery performance has occurred, then step 140 may advance the method to the next step so that adjustments to the SOC operating range can be made. Consider the situation where the battery capacity has degraded to the point where vehicle battery 30 can no longer adequately accept charge from regenerative braking operations so that engine 36 is running and driving generator 38 on a regular basis, or the case where the battery resistance has risen to the point where battery 30 can no longer deliver enough power for cold cranking. In both of these situations, the battery performance has diminished to the point where the present method may try and compensate for the degradation by making changes to the SOC operating range, as explained below.

It should be appreciated that the reduction or degradation in battery performance does not necessarily need to be as severe as in the examples above in order for the method to employ a dynamic SOC operating range, as changes to that range can be made in response to less significant battery degradation as well. The exact point at which the present method chooses to intervene and make changes to the SOC operating range may vary by vehicle, battery, operating history, etc., and is certainly not limited to any one particular threshold. In one embodiment, the method may begin changing or adjusting the SOC operating range as soon as any appreciable battery degradation is detected; in another embodiment, the method may begin altering the SOC operating range when the reduction in battery performance becomes noticeable to the driver. Other battery conditions and parameters, instead of just battery capacity and resistance, may also be used by step 140.

Figure 3:
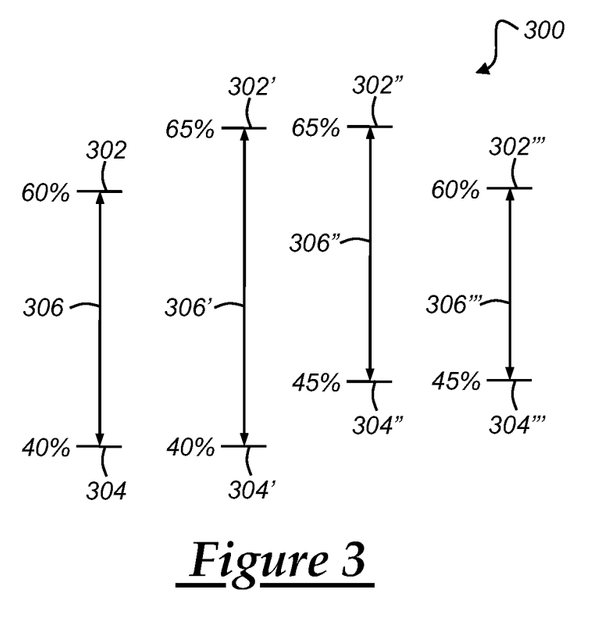
FIGS. 3-4 are diagrams showing several different exemplary state-of-charge (SOC) operating ranges, and are provided to help illustrate some of the steps in the method in FIG. 2.
Figure 4:
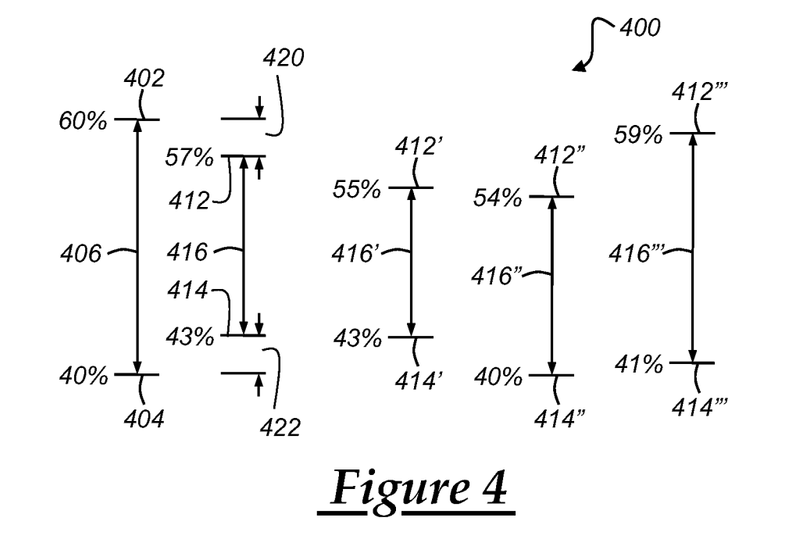

Steps 150-180 are described below in conjunction with the illustrative diagrams shown in FIGS. 3-4. Once the method determines that there has been a degradation or other change in the state of the battery, steps 150-180 may manipulate, adjust or otherwise control a state-of-charge (SOC) operating range in order to improve the battery performance and thereby extend the battery life. Any number of different methods and techniques may be used to change or manipulate the SOC operating range, including those of exemplary step 160 which control one or more hard boundaries of the range and those of exemplary step 170 which control one or more soft boundaries of the range. The term "hard boundary," as used herein, broadly refers to any limit, threshold and/or other boundary that controls the amount of charge on the battery and applies to all charging and discharging events. For example, if vehicle battery 30 were to have an upper hard boundary of 80% SOC, then the vehicle would not charge the battery more than 80%, no matter what the charging event. The term "soft boundary," on the other hand, broadly refers to any limit, threshold and/or other boundary that controls the amount of charge on the battery, but only applies to certain charging and discharging events. If vehicle battery 30 were to have an upper soft boundary of 75% SOC, for example, then the vehicle would not allow certain charging events (e.g., opportunity charging) to charge the battery beyond 75%, but would allow other charging events (e.g., regenerative braking) to continue to charge the battery beyond the soft boundary and up to the hard boundary. In a way, the hard boundaries act as absolute thresholds for all charging and discharging events, while the soft boundaries only act as thresholds for certain types of charging and discharging events. An upper and lower hard boundary may together define a hard SOC operating range, and an upper and lower soft boundary may together define a soft SOC operating range.

Turning to step 150, the method determines if an upper and/or lower hard boundary should be changed or manipulated. For instance, if there has been an increase in battery resistance that may impair the battery's ability to crank engine 36, then step 150 may determine that the upper hard boundary needs to be increased. If the battery capacity has decreased to a point where engine 36 is routinely being turned on to drive the generator, then step 150 may determine that it is desirable to decrease the lower hard boundary. Step 150 may use any number of different factors, including battery conditions like voltage, current, temperature, battery life, etc., as well as other factors that are more seasonal in order to determine if changes should be made to the upper and/or lower hard boundaries. If step 150 determines that the hard boundaries do not need to be changed, then the method may proceed to step 170; if hard boundary changes are desirable, then the method may proceed to step 160.

Step 160 changes or adjusts an upper and/or lower hard boundary that defines a hard SOC operating range. This step is described in conjunction with FIG. 3, which illustrates an example of an initial hard SOC operating range 300 that has an upper boundary 302 of 60%, a lower boundary 304 of 40%, and a window or delta 306 of 20%. Based on factors such as those discussed above, step 160 may increase a hard boundary, decrease a hard boundary, or move both hard boundaries together such that window 306 widens, narrows or simply shifts up or down. Consider the example where the battery resistance has increased to the point that battery 30 cannot generate a desirable level of power. Step 160 may increase upper hard boundary 302' from 60% to 65%, while leaving lower hard boundary 304' alone; this is an example of widening window 306'. In a different embodiment, step 160 may increase both upper hard boundary 302" from 60% to 65% and lower hard boundary 304" from 40% to 45%; this is an example of shifting window 306" upwards, while leaving the size of the window the same. In yet another embodiment, step 160 could leave upper hard boundary 302''' untouched while increasing lower hard boundary 304'''; this is an example of decreasing or shrinking window 306'''. Other methods and techniques for manipulating or controlling the SOC operating range 300 could certainly be employed, as the preceding embodiments only represent some of the potential options.

It is possible for there to be certain limits on the upper hard boundary, the lower hard boundary, the window, or a combination thereof. For instance, the method may adhere to an upper hard boundary limit of 85% SOC, for above that limit the battery may not be able to adequately accept charge from regenerative braking operations. Similarly, the method may observe a lower hard boundary limit of 25%, as the battery is unable to crank the engine at a charge level below this. The 85% and 25% limits mentioned above are only exemplary, as those thresholds could easily vary depending on the vehicle, the battery, etc. These and other constraints may influence the adjustments to the SOC operating range that are made by step 160.

Next, the method determines if an upper and/or lower soft boundary should be changed or manipulated, step 170. As mentioned above, soft boundaries usually only apply to certain charging and discharging events; for example, non-critical events like opportunity charging when the vehicle has access to an electric outlet. The conditions that warrant changes to soft boundaries may be different from those that warrant changes to their hard boundary counterparts. By manipulating one or both soft boundaries, the method may allow more critical activities like regenerative braking or electric mode propulsion, but at the same time curtail non-critical activities like opportunity charging that could negatively impact battery life. Step 170 may be used to prioritize various charging and/or discharging events and determine which activities will be allowed that generate and/or consume electric power. The decision made by step 170 may use a number of different factors or input, such as battery conditions like temperature and battery life. In one embodiment, step 170 uses battery temperature and/or other seasonal factors so that a dynamic SOC can be used that maximizes battery life in cold weather. In another embodiment, step 170 utilizes battery life when determining whether or not to adjust the soft boundaries; this, in turn, may help extend the duration of the battery when it is near an end of life status. If step 170 determines that the soft boundaries do not need to be changed or otherwise addressed, then the method may finish or loop back near the beginning for additional monitoring; if step 170 determines that one or more soft boundaries need to be changed or addressed, then the method may proceed to step 180.

Step 180 is an optional step that changes one or more soft boundaries of the SOC operating range. As with the hard boundaries addressed above, the method may change or adjust the soft boundaries by increasing or decreasing the soft boundaries, by changing just one or both of the boundaries so that the corresponding window changes size, or by changing both boundaries in tandem so that the window is shifted but does not change in size. The various embodiments and techniques discussed above in conjunction with step 160 apply here as well and are not reiterated in their entirety. Step 180 is described with reference to FIG. 4, which illustrates an example of an initial SOC operating range 400 having both hard and soft boundaries. Hard boundaries 402, 404 and hard window 406 are similar to those discussed above. In addition, range 400 also includes an upper soft boundary 412 of 57%, a lower soft boundary 414 of 43%, and a window or delta 416 of 14%. It is generally preferable that the soft boundaries 412, 414 be within or bounded by the hard boundaries 402, 404 so that selective ranges 420, 422 are established were certain charging and/or discharging events are allowed and certain non-critical events are prevented.

To illustrate this feature, consider the example where the current SOC level is 55% and is increasing because the vehicle is plugged into an electrical outlet (i.e., opportunity charging). Once the SOC level hits 57% (soft boundary 412), the method may prevent additional opportunity charging, as this is sometimes considered a non-critical activity. If, however, the vehicle were to subsequently be unplugged and driven and a regenerative braking event was encountered, the method would allow additional charging until the battery SOC hit 60% (hard boundary 402). This is an example where a selective range 420 allows regenerative charging, but not opportunity charging. Other examples and embodiments of such soft boundaries and selective ranges are certainly possible, as the preceding example represents only one possibility. It is not always the case that opportunity charging is an event or activity that is excluded or prevented by the soft boundaries. The exact list of activities that are allowed by the soft boundaries may certain differ from those discussed here.

Step 180 is not limited to changing or modifying soft boundaries, as it may be used to establish or create soft boundaries where none currently exist. As mentioned above, step 180 is optional; thus, it is possible for method 100 to operate with only hard boundaries. If at some time the method determines that one or more soft boundaries may be beneficial for controlling or prioritizing different charging and/or discharging events, then step 180 may be used to establish upper and/or lower soft boundaries and the corresponding soft boundary window that is defined thereby. If soft boundaries already exist, then step 180 may be used to change, adjust or otherwise modify these boundaries. For instance, step 180 may increase a soft boundary, decrease a soft boundary, or move both soft boundaries together such that the soft window widens, narrows or simply shifts up or down.

According to several non-limiting examples, step 180 may decrease upper soft boundary 412' from 57% to 55%, while leaving lower soft boundary 414' alone; this is an example of decreasing or shrinking window 416'. In another embodiment, step 180 decreases both the upper and lower soft boundaries 412" and 414" by 3% so that the overall width or size of window 416" is the same as it initially was, only now it has been shifted. This example marks a situation where a soft and hard boundary are the same (lower hard and soft boundaries are both 40%). In yet another embodiment, step 180 both increases upper soft boundary 412''' from 57% to 59% and decreases lower soft boundary 414''' from 43% to 41% so that the overall soft window 416' is expanded or widened from 14% to 18%. Generally speaking, it is possible for the upper and/or lower soft boundary to be equal to a corresponding hard boundary, but they should not be outside of the range or window created by the hard boundaries. Put differently, the upper soft boundary should be equal to or less than the upper hard boundary, and the lower soft boundary should be equal to or greater than the lower hard boundary.

All of the exemplary changes and adjustments described above are meant to be part of or influence the state-of-charge (SOC) operating range. The method may change or adjust the SOC operating range on a battery performance basis (i.e., in response to changes in battery performance) or on a periodic basis, to cite two possibilities. For example, method 100 may be performed every week, month or other time frame so that the SOC operating range is continually adjusted and improved. Method 100 may also be employed when the vehicle battery is replaced or fixed, as the new or fixed battery may exhibit different battery conditions than its predecessor. The upper and lower boundaries may vary and depend on several parameters including battery type, size, chemistry, age, etc. and vehicle size, power requirement and/or other parameters. It should be appreciated that the precise order and/or combination of SOC operating range adjustments is not limited to the examples provided here. For instance, the method could evaluate and make changes to the soft boundaries in steps 170, 180 before doing so to the hard boundaries in steps 150, 160. Other changes are certainly possible.

It is to be understood that the foregoing description is not a definition of the invention, but is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. For example, the specific combination and order of steps is just one possibility, as the present method may include a combination of steps that has fewer, greater or different steps than that shown here. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that that the listing is not to be considered as excluding other, additional components or items. Other terms are to be construed using their broadest reasonable meaning unless they are used in a context that requires a different interpretation.

The invention claimed is:

1. A method for controlling a vehicle battery, comprising the steps of:
    (a) determining a present state of the vehicle battery, wherein the vehicle battery is at least partially used for vehicle propulsion;
    (b) evaluating the present state of the vehicle battery to determine if the vehicle battery has experienced a reduction in battery performance that indicates the vehicle battery is at or near an end of its operational life; and
    (c) if the vehicle battery has experienced a reduction in battery performance that indicates the vehicle battery is at or near an end of its operational life, then adjusting a state-of-charge (SOC) operating range by establishing an upper soft boundary in response to the indication that the vehicle battery is at or near an end of its operational life so that the battery performance is improved to an acceptable level where the need to immediately replace the vehicle battery is avoided and the operational life of the vehicle battery is extended, wherein the adjusted SOC operating range includes an upper hard boundary that partially defines a hard window and the upper soft boundary that is less than the upper hard boundary and partially defines a soft window, when the SOC of the vehicle battery is less than the upper soft boundary both regenerative braking charging and opportunity charging are permitted, when the SOC of the vehicle battery is greater than the upper soft boundary but less than the upper hard boundary only regenerative braking charging is permitted, and when the SOC of the vehicle battery is greater than the upper hard boundary no charging is permitted.

2. The method of claim 1, wherein step (a) further comprises using a battery capacity, a battery resistance, or both to determine the present state of the vehicle battery.

3. The method of claim 2, wherein step (a) further comprises directly measuring the battery capacity, the battery resistance, or both with one or more battery sensors.

4. The method of claim 2, wherein step (a) further comprises indirectly calculating the battery capacity, the battery resistance, or both with one or more other battery conditions.

5. The method of claim 1, wherein step (b) further comprises comparing the present state of the vehicle battery to an initial state of the vehicle battery, and using the results of the comparison to determine if the vehicle battery has experienced a reduction in battery performance.

6. The method of claim 5, wherein the comparison involves values for a battery capacity, a battery resistance, or both.

7. The method of claim 1, wherein step (b) further comprises comparing the present state of the vehicle battery to a battery threshold, and using the results of the comparison to determine if the vehicle battery has experienced a reduction in battery performance.

8. The method of claim 7, wherein the comparison involves values for a battery capacity, a battery resistance, or both.

9. The method of claim 1, wherein step (c) further comprises adjusting the SOC operating range by making changes to an upper soft or hard SOC boundary, a lower soft or hard SOC boundary, or a combination thereof so that the SOC operating range is shifted but remains the same size.

10. The method of claim 1, wherein step (c) further comprises adjusting the SOC operating range by making changes to an upper soft or hard SOC boundary, a lower soft or hard SOC boundary, or a combination thereof so that the size of the SOC operating range is modified.

11. The method of claim 1, wherein step (c) further comprises adjusting the SOC operating range by making changes to one or more of the hard boundaries, and all charging and/or discharging events are limited by the hard boundaries.

12. A method of for controlling a vehicle battery, comprising the steps of:
(a) determining a present state of the vehicle battery, wherein the vehicle battery is at least partially used for vehicle propulsion;
(b) evaluating the present state of the vehicle battery to determine if the vehicle battery has experienced a reduction in battery performance; and
(c) if the vehicle battery has experienced a reduction in battery performance, then adjusting a SOC operating range so that the battery performance is improved by creating one or more soft boundaries or adjusting the one or more soft boundaries if they were previously created, wherein the SOC operating range includes an upper hard boundary and a lower hard boundary that together define a hard window and an upper soft boundary and a lower soft boundary that together define a soft window, and the soft window is only for some charging and/or discharging events and is within the hard window so that the soft boundaries are equal to or within the hard boundaries, wherein opportunity charging is limited to the soft window and regenerative braking charging is limited to either the soft window or the hard window.

13. The method of claim 12, wherein one or more selective ranges are formed between the soft window and the hard window where certain charging and/or discharging events are allowed and certain charging and/or discharging events are prevented.

* * * * *